(12) United States Patent
Miles et al.

(10) Patent No.: US 7,550,794 B2
(45) Date of Patent: Jun. 23, 2009

(54) MICROMECHANICAL SYSTEMS DEVICE COMPRISING A DISPLACEABLE ELECTRODE AND A CHARGE-TRAPPING LAYER

(75) Inventors: Mark W. Miles, San Francisco, CA (US); John Batey, San Francisco, CA (US); Clarence Chui, Emeryville, CA (US); Manish Kothari, Redwood City, CA (US)

(73) Assignee: IDC, LLC, Pleasanton, CA (US)

( * ) Notice: Subject to any disclaimer, the term of this patent is extended or adjusted under 35 U.S.C. 154(b) by 0 days.

(21) Appl. No.: 10/251,196

(22) Filed: Sep. 20, 2002

(65) Prior Publication Data

US 2004/0058532 A1    Mar. 25, 2004

(51) Int. Cl.
*H01L 27/20* (2006.01)
*H01L 29/84* (2006.01)

(52) U.S. Cl. ................ 257/254; 257/E27.006
(58) Field of Classification Search ............. 438/48–53; 257/254
See application file for complete search history.

(56) References Cited

U.S. PATENT DOCUMENTS

| | | | |
|---|---|---|---|
| 2,534,846 A | 12/1950 | Ambrose et al. |
| 3,439,973 A | 4/1969 | Paul et al. |
| 3,443,854 A | 5/1969 | Weiss |
| 3,616,312 A | 10/1971 | McGriff et al. |
| 3,653,741 A | 4/1972 | Marks |
| 3,656,836 A | 4/1972 | de Cremoux et al. |
| 3,725,868 A | 4/1973 | Malmer, Jr. et al. |
| 3,813,265 A | 5/1974 | Marks |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |

(Continued)

FOREIGN PATENT DOCUMENTS

CH            680534         9/1992

(Continued)

OTHER PUBLICATIONS

Aratani, et al., "Process and design considerations for surface micromachined beams for a tuneable interferometer array in silicon," Proceedings of the Workshop on Micro Electro Mechanical Systems (MEMS), Fort Lauderdale, FL, IEEE Catalog No. 93CH6265-6, Library of Congress No. 92-56273, (Feb. 7-10, 1993).

(Continued)

*Primary Examiner*—Thanh Nguyen
(74) *Attorney, Agent, or Firm*—Knobbe Martens Olson & Bear LLP

(57) ABSTRACT

In one embodiment, the invention provides a method for fabricating a microelectromechanical systems device. The method comprises fabricating a first layer comprising a film having a characteristic electromechanical response, and a characteristic optical response, wherein the characteristic optical response is desirable and the characteristic electromechanical response is undesirable; and modifying the characteristic electromechanical response of the first layer by at least reducing charge build up thereon during activation of the microelectromechanical systems device.

13 Claims, 8 Drawing Sheets

U.S. PATENT DOCUMENTS

| | | |
|---|---|---|
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,218,472 A | 6/1993 | Jozefowicz et al. |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,488,505 A | 1/1996 | Engle |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,578,976 A | 11/1996 | Yao |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoads et al. |

| | | | | | | |
|---|---|---|---|---|---|---|
| 5,619,366 A | 4/1997 | Rhoads et al. | 6,160,833 A | 12/2000 | Floyd et al. | |
| 5,622,814 A | 4/1997 | Miyata et al. | 6,166,422 A | 12/2000 | Qian et al. | |
| 5,629,790 A | 5/1997 | Neukermans et al. | 6,180,428 B1 | 1/2001 | Peeters et al. | |
| 5,633,652 A | 5/1997 | Kanbe et al. | 6,194,323 B1 | 2/2001 | Downey et al. | |
| 5,636,052 A | 6/1997 | Arney et al. | 6,195,196 B1 * | 2/2001 | Kimura et al. | 359/295 |
| 5,636,185 A | 6/1997 | Brewer et al. | 6,201,633 B1 | 3/2001 | Peeters et al. | |
| 5,638,084 A | 6/1997 | Kalt | 6,204,080 B1 | 3/2001 | Hwang | |
| 5,638,946 A | 6/1997 | Zavracky | 6,232,936 B1 | 5/2001 | Gove et al. | |
| 5,641,391 A | 6/1997 | Hunter et al. | 6,243,149 B1 | 6/2001 | Swanson et al. | |
| 5,646,768 A | 7/1997 | Kaeriyama | 6,246,398 B1 | 6/2001 | Koo | |
| 5,647,819 A | 7/1997 | Fujita et al. | 6,249,039 B1 | 6/2001 | Harvey et al. | |
| 5,650,834 A | 7/1997 | Nakagawa et al. | 6,282,010 B1 | 8/2001 | Sulzbach et al. | |
| 5,650,881 A | 7/1997 | Hornbeck | 6,284,560 B1 | 9/2001 | Jech et al. | |
| 5,654,741 A | 8/1997 | Sampsell et al. | 6,295,154 B1 | 9/2001 | Laor et al. | |
| 5,657,099 A | 8/1997 | Doherty et al. | 6,323,982 B1 | 11/2001 | Hornbeck | |
| 5,659,374 A | 8/1997 | Gale, Jr. et al. | 6,327,071 B1 | 12/2001 | Kimura et al. | |
| 5,665,997 A | 9/1997 | Weaver et al. | 6,329,297 B1 | 12/2001 | Balish et al. | |
| 5,673,139 A | 9/1997 | Johnson | 6,333,556 B1 | 12/2001 | Juengling et al. | |
| 5,674,757 A | 10/1997 | Kim | 6,335,831 B2 | 1/2002 | Kowarz et al. | |
| 5,683,591 A | 11/1997 | Offenberg | 6,351,329 B1 | 2/2002 | Greywal | |
| 5,703,710 A | 12/1997 | Brinkman et al. | 6,356,254 B1 * | 3/2002 | Kimura | 345/108 |
| 5,706,022 A | 1/1998 | Hato | 6,376,787 B1 | 4/2002 | Martin et al. | |
| 5,710,656 A | 1/1998 | Goosen | 6,391,675 B1 | 5/2002 | Ehmke et al. | |
| 5,726,480 A | 3/1998 | Pister | 6,392,233 B1 * | 5/2002 | Channin et al. | 250/338.1 |
| 5,737,050 A | 4/1998 | Takahara et al. | 6,392,781 B1 | 5/2002 | Kim et al. | |
| 5,739,945 A | 4/1998 | Tayebati | 6,407,851 B1 | 6/2002 | Islam et al. | |
| 5,745,193 A | 4/1998 | Urbanus et al. | 6,446,486 B1 * | 9/2002 | deBoer et al. | 73/9 |
| 5,745,281 A | 4/1998 | Yi et al. | 6,447,126 B1 | 9/2002 | Hornbeck | |
| 5,771,116 A | 6/1998 | Miller et al. | 6,452,124 B1 | 9/2002 | York et al. | |
| 5,771,321 A * | 6/1998 | Stern | 385/31 | 6,452,465 B1 | 9/2002 | Brown et al. | |
| 5,784,189 A | 7/1998 | Bozler et al. | 6,456,420 B1 | 9/2002 | Goodwin-Johansson | |
| 5,784,190 A | 7/1998 | Worley | 6,465,355 B1 | 10/2002 | Horsley | |
| 5,784,212 A | 7/1998 | Hornbeck | 6,466,354 B1 * | 10/2002 | Gudeman | 359/291 |
| 5,793,504 A | 8/1998 | Stoll | 6,466,358 B2 | 10/2002 | Tew | |
| 5,808,780 A | 9/1998 | McDonald | 6,473,274 B1 | 10/2002 | Maimone et al. | |
| 5,818,095 A | 10/1998 | Sampsell | 6,480,177 B2 | 11/2002 | Doherty et al. | |
| 5,822,170 A | 10/1998 | Cabuz et al. | 6,496,122 B2 | 12/2002 | Sampsell | |
| 5,824,608 A | 10/1998 | Gotoch et al. | 6,513,911 B1 * | 2/2003 | Ozaki et al. | 347/58 |
| 5,825,528 A | 10/1998 | Goosen | 6,522,801 B1 | 2/2003 | Aksyuk et al. | |
| 5,835,255 A | 11/1998 | Miles | 6,531,945 B1 | 3/2003 | Ahn et al. | |
| 5,835,256 A | 11/1998 | Huibers | 6,537,427 B1 | 3/2003 | Raina et al. | |
| 5,838,484 A | 11/1998 | Goosen et al. | 6,545,335 B1 | 4/2003 | Chua et al. | |
| 5,842,088 A | 11/1998 | Thompson | 6,548,908 B2 | 4/2003 | Chua et al. | |
| 5,867,302 A | 2/1999 | Fleming et al. | 6,549,338 B1 | 4/2003 | Wolverton et al. | |
| 5,912,758 A | 6/1999 | Knipe et al. | 6,552,840 B2 | 4/2003 | Knipe | |
| 5,926,309 A | 7/1999 | Little | 6,574,033 B1 | 6/2003 | Chui et al. | |
| 5,943,155 A | 8/1999 | Goossen | 6,577,785 B1 | 6/2003 | Spahn et al. | |
| 5,943,158 A | 8/1999 | Ford et al. | 6,589,625 B1 | 7/2003 | Kothari et al. | |
| 5,959,763 A | 9/1999 | Bozler et al. | 6,600,201 B2 | 7/2003 | Hartwell et al. | |
| 5,967,163 A | 10/1999 | Pan et al. | 6,606,175 B1 | 8/2003 | Sampsell et al. | |
| 5,972,193 A | 10/1999 | Chou et al. | 6,608,268 B1 | 8/2003 | Goldsmith | |
| 5,976,902 A | 11/1999 | Shih | 6,610,440 B1 | 8/2003 | LaFollette et al. | |
| 5,986,796 A | 11/1999 | Miles | 6,618,187 B2 | 9/2003 | Pilossof | |
| 6,016,693 A | 1/2000 | Viani et al. | 6,624,944 B1 | 9/2003 | Wallace et al. | |
| 6,028,690 A | 2/2000 | Carter et al. | 6,625,047 B2 | 9/2003 | Coleman, Jr. | |
| 6,031,653 A | 2/2000 | Wang | 6,630,786 B2 | 10/2003 | Cummings et al. | |
| 6,038,056 A | 3/2000 | Florence et al. | 6,632,698 B2 | 10/2003 | Ives | |
| 6,040,937 A | 3/2000 | Miles | 6,635,919 B1 | 10/2003 | Melendez et al. | |
| 6,049,317 A | 4/2000 | Thompson et al. | 6,639,724 B2 | 10/2003 | Bower et al. | |
| 6,055,090 A | 4/2000 | Miles | 6,642,913 B1 | 11/2003 | Kimura et al. | |
| 6,057,903 A | 5/2000 | Colgan et al. | 6,643,069 B2 | 11/2003 | Dewald | |
| 6,061,075 A | 5/2000 | Nelson et al. | 6,650,455 B2 | 11/2003 | Miles | |
| 6,088,162 A | 7/2000 | Someno | 6,653,997 B2 | 11/2003 | Van Gorkom et al. | |
| 6,097,145 A | 8/2000 | Kastalsky et al. | 6,657,832 B2 | 12/2003 | Williams et al. | |
| 6,099,132 A | 8/2000 | Kaeriyama | 6,666,561 B1 | 12/2003 | Blakley | |
| 6,100,477 A | 8/2000 | Randall et al. | 6,674,562 B1 | 1/2004 | Miles et al. | |
| 6,100,872 A | 8/2000 | Aratani et al. | 6,674,563 B2 | 1/2004 | Chui et al. | |
| 6,113,239 A | 9/2000 | Sampsell et al. | 6,680,792 B2 | 1/2004 | Miles | |
| 6,115,326 A | 9/2000 | Puma et al. | 6,710,908 B2 | 3/2004 | Miles et al. | |
| 6,137,150 A | 10/2000 | Takeuchi et al. | 6,720,267 B1 | 4/2004 | Chen et al. | |
| 6,147,790 A | 11/2000 | Meier et al. | 6,736,987 B1 | 5/2004 | Cho | |
| 6,149,190 A | 11/2000 | Galvin et al. | 6,741,377 B2 | 5/2004 | Miles | |
| 6,158,156 A | 12/2000 | Patrick | 6,741,384 B1 | 5/2004 | Martin et al. | |

| | | | | | | |
|---|---|---|---|---|---|---|
| 6,741,503 B1 | 5/2004 | Farris et al. | | 2003/0053078 A1 | 3/2003 | Missey et al. |
| 6,743,570 B2 | 6/2004 | Harnett et al. | | 2003/0054588 A1 | 3/2003 | Patel et al. |
| 6,747,785 B2 | 6/2004 | Chen et al. | | 2003/0062186 A1 | 4/2003 | Boroson et al. |
| 6,747,800 B1 | 6/2004 | Lin | | 2003/0072070 A1 | 4/2003 | Miles |
| 6,756,317 B2 | 6/2004 | Sniegowski et al. | | 2003/0077843 A1 | 4/2003 | Yamauchi et al. |
| 6,768,097 B1 | 7/2004 | Viktorovitch et al. | | 2003/0090350 A1 | 5/2003 | Feng et al. |
| 6,775,174 B2 | 8/2004 | Huffman et al. | | 2003/0112096 A1 | 6/2003 | Potter |
| 6,778,155 B2 | 8/2004 | Doherty et al. | | 2003/0132822 A1 | 7/2003 | Ko et al. |
| 6,778,306 B2 | 8/2004 | Sniegowski et al. | | 2003/0138213 A1 | 7/2003 | Jin et al. |
| 6,781,239 B1 | 8/2004 | Yegnashankaran et al. | | 2003/0152872 A1 | 8/2003 | Miles |
| 6,791,441 B2 | 9/2004 | Pillans et al. | | 2003/0156315 A1 | 8/2003 | Li et al. |
| 6,794,119 B2 | 9/2004 | Miles | | 2003/0164350 A1 | 9/2003 | Hanson et al. |
| 6,811,267 B1 | 11/2004 | Allen et al. | | 2003/0201784 A1 | 10/2003 | Potter |
| 6,812,482 B2 | 11/2004 | Fleming et al. | | 2003/0202264 A1 | 10/2003 | Weber et al. |
| 6,819,469 B1 | 11/2004 | Koba | | 2003/0202265 A1 | 10/2003 | Reboa et al. |
| 6,822,628 B2 | 11/2004 | Dunphy et al. | | 2003/0202266 A1 | 10/2003 | Ring et al. |
| 6,829,132 B2 | 12/2004 | Martin et al. | | 2003/0210851 A1 | 11/2003 | Fu et al. |
| 6,853,129 B1 | 2/2005 | Cummings et al. | | 2003/0231373 A1 | 12/2003 | Kowarz et al. |
| 6,855,610 B2 | 2/2005 | Tung et al. | | 2004/0010115 A1 | 1/2004 | Sotzing |
| 6,859,218 B1 | 2/2005 | Luman et al. | | 2004/0027636 A1* | 2/2004 | Miles ..................... 359/243 |
| 6,861,277 B1 | 3/2005 | Monroe et al. | | 2004/0027671 A1 | 2/2004 | Wu et al. |
| 6,862,022 B2 | 3/2005 | Slupe | | 2004/0027701 A1 | 2/2004 | Ishikawa |
| 6,862,029 B1 | 3/2005 | D'Souza et al. | | 2004/0028849 A1 | 2/2004 | Stark et al. |
| 6,867,896 B2 | 3/2005 | Miles | | 2004/0035821 A1 | 2/2004 | Doan et al. |
| 6,870,581 B2 | 3/2005 | Li et al. | | 2004/0051929 A1 | 3/2004 | Sampsell et al. |
| 6,870,654 B2 | 3/2005 | Lin et al. | | 2004/0053434 A1 | 3/2004 | Bruner |
| 6,882,458 B2 | 4/2005 | Lin et al. | | 2004/0056742 A1 | 3/2004 | Dabbaj |
| 6,882,461 B1 | 4/2005 | Tsai et al. | | 2004/0058532 A1 | 3/2004 | Miles et al. |
| 6,912,022 B2 | 6/2005 | Lin et al. | | 2004/0061543 A1 | 4/2004 | Nam et al. |
| 6,940,631 B2* | 9/2005 | Ishikawa .................... 359/291 | | 2004/0063322 A1 | 4/2004 | Yang |
| 6,952,303 B2 | 10/2005 | Lin et al. | | 2004/0080807 A1 | 4/2004 | Chen et al. |
| 6,952,304 B2 | 10/2005 | Mushika et al. | | 2004/0080832 A1 | 4/2004 | Singh |
| 6,958,847 B2 | 10/2005 | Lin | | 2004/0100677 A1 | 5/2004 | Huibers et al. |
| 7,016,099 B2 | 3/2006 | Ikeda et al. | | 2004/0124073 A1* | 7/2004 | Pillans et al. ............... 200/181 |
| 7,110,158 B2 | 9/2006 | Miles | | 2004/0125281 A1 | 7/2004 | Lin et al. |
| 7,123,216 B1 | 10/2006 | Miles | | 2004/0125282 A1 | 7/2004 | Lin et al. |
| 7,250,315 B2 | 7/2007 | Miles | | 2004/0136076 A1 | 7/2004 | Tayebati |
| 2001/0003487 A1 | 6/2001 | Miles | | 2004/0145049 A1 | 7/2004 | McKinnell et al. |
| 2001/0010953 A1 | 8/2001 | Kang et al. | | 2004/0145811 A1 | 7/2004 | Lin et al. |
| 2001/0026951 A1 | 10/2001 | Vergani et al. | | 2004/0147056 A1 | 7/2004 | McKinnell et al. |
| 2001/0040649 A1 | 11/2001 | Ozaki | | 2004/0147198 A1 | 7/2004 | Lin et al. |
| 2001/0040675 A1 | 11/2001 | True et al. | | 2004/0148009 A1 | 7/2004 | Buzzard |
| 2001/0055208 A1 | 12/2001 | Kimura | | 2004/0150869 A1 | 8/2004 | Kasai |
| 2002/0015215 A1 | 2/2002 | Miles | | 2004/0160143 A1 | 8/2004 | Shreeve et al. |
| 2002/0021485 A1 | 2/2002 | Pilossof | | 2004/0174583 A1 | 9/2004 | Chen et al. |
| 2002/0024711 A1 | 2/2002 | Miles | | 2004/0175577 A1 | 9/2004 | Lin et al. |
| 2002/0036304 A1 | 3/2002 | Ehmke et al. | | 2004/0179281 A1 | 9/2004 | Reboa |
| 2002/0054424 A1 | 5/2002 | Miles | | 2004/0191937 A1 | 9/2004 | Patel et al. |
| 2002/0055253 A1 | 5/2002 | Rudhard | | 2004/0207897 A1 | 10/2004 | Lin |
| 2002/0058422 A1 | 5/2002 | Jang et al. | | 2004/0209192 A1 | 10/2004 | Lin et al. |
| 2002/0070931 A1 | 6/2002 | Ishikawa | | 2004/0209195 A1 | 10/2004 | Lin |
| 2002/0071169 A1 | 6/2002 | Bowers et al. | | 2004/0212026 A1 | 10/2004 | Van Brocklin et al. |
| 2002/0075555 A1 | 6/2002 | Miles | | 2004/0217378 A1 | 11/2004 | Martin et al. |
| 2002/0086455 A1 | 7/2002 | Franosch et al. | | 2004/0217919 A1 | 11/2004 | Piehl et al. |
| 2002/0109899 A1 | 8/2002 | Ohtaka et al. | | 2004/0218251 A1 | 11/2004 | Piehl et al. |
| 2002/0126364 A1 | 9/2002 | Miles | | 2004/0218334 A1 | 11/2004 | Martin et al. |
| 2002/0131682 A1 | 9/2002 | Nasiri et al. | | 2004/0218341 A1 | 11/2004 | Martin et al. |
| 2002/0135857 A1* | 9/2002 | Fitzpatrick et al. .......... 359/291 | | 2004/0227493 A1 | 11/2004 | Van Brocklin et al. |
| 2002/0137072 A1 | 9/2002 | Mirkin et al. | | 2004/0240027 A1 | 12/2004 | Lin et al. |
| 2002/0149828 A1 | 10/2002 | Miles | | 2004/0240032 A1 | 12/2004 | Miles |
| 2002/0149850 A1 | 10/2002 | Heffner et al. | | 2004/0240138 A1 | 12/2004 | Martin et al. |
| 2002/0167072 A1 | 11/2002 | Andosca | | 2004/0245588 A1 | 12/2004 | Nikkel et al. |
| 2002/0168136 A1 | 11/2002 | Atia et al. | | 2004/0263944 A1 | 12/2004 | Miles et al. |
| 2002/0171610 A1 | 11/2002 | Siwinski et al. | | 2005/0001828 A1 | 1/2005 | Martin et al. |
| 2002/0186209 A1 | 12/2002 | Cok | | 2005/0003667 A1 | 1/2005 | Lin et al. |
| 2002/0195681 A1 | 12/2002 | Melendez et al. | | 2005/0020089 A1 | 1/2005 | Shi et al. |
| 2003/0006468 A1 | 1/2003 | Ma et al. | | 2005/0024557 A1 | 2/2005 | Lin |
| 2003/0007107 A1 | 1/2003 | Chae | | 2005/0035699 A1 | 2/2005 | Tsai |
| 2003/0015936 A1 | 1/2003 | Yoon et al. | | 2005/0036095 A1 | 2/2005 | Yeh et al. |
| 2003/0016428 A1 | 1/2003 | Kato et al. | | 2005/0036192 A1 | 2/2005 | Lin et al. |
| 2003/0021004 A1 | 1/2003 | Cunningham et al. | | 2005/0038950 A1 | 2/2005 | Adelmann |
| 2003/0029705 A1 | 2/2003 | Qiu et al. | | 2005/0042117 A1 | 2/2005 | Lin |
| 2003/0043157 A1 | 3/2003 | Miles | | 2005/0046922 A1 | 3/2005 | Lin et al. |

| | | | |
|---|---|---|---|
| 2005/0046948 A1 | 3/2005 | Lin | |
| 2005/0057442 A1 | 3/2005 | Way | |
| 2005/0068583 A1 | 3/2005 | Gutkowski et al. | |
| 2005/0068605 A1 | 3/2005 | Tsai | |
| 2005/0068606 A1 | 3/2005 | Tsai | |
| 2005/0069209 A1 | 3/2005 | Damera-Venkata et al. | |
| 2005/0078348 A1 | 4/2005 | Lin | |
| 2005/0168849 A1 | 8/2005 | Lin | |
| 2005/0195462 A1 | 9/2005 | Lin | |
| 2005/0195467 A1 | 9/2005 | Kothari et al. | |
| 2005/0202649 A1 | 9/2005 | Hung et al. | |
| 2006/0050350 A1 | 3/2006 | Rijks et al. | |
| 2006/0066932 A1 | 3/2006 | Chui et al. | |
| 2006/0066935 A1 | 3/2006 | Cummings et al. | |
| 2006/0261330 A1 | 11/2006 | Miles | |
| 2007/0121205 A1 | 5/2007 | Miles | |
| 2008/0026328 A1 | 1/2008 | Miles | |

FOREIGN PATENT DOCUMENTS

| | | |
|---|---|---|
| CH | 681 047 | 12/1992 |
| CN | 092109265 | 11/2003 |
| DE | 10228946 A1 | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0 695 959 | 2/1996 |
| EP | 0 788 005 | 8/1997 |
| EP | 0 878 824 A2 | 11/1998 |
| EP | 1 170 618 | 1/2002 |
| EP | 1 197 778 | 4/2002 |
| EP | 1258860 A1 | 11/2002 |
| EP | 1 452 481 A | 9/2004 |
| FR | 2824643 | 10/1999 |
| JP | 405275401 A | 10/1993 |
| JP | 06-281956 | 10/1994 |
| JP | 07-45550 | 2/1995 |
| JP | 09-036387 | 2/1997 |
| JP | 9-127439 | 5/1997 |
| JP | 10500224 | 1/1998 |
| JP | 10-116996 | 5/1998 |
| JP | 10-148644 | 6/1998 |
| JP | 10-267658 | 10/1998 |
| JP | 11211999 A | 8/1999 |
| JP | 11-263012 | 9/1999 |
| JP | 11243214 | 9/1999 |
| JP | 2000-40831 A | 2/2000 |
| JP | 2002-062490 | 2/2002 |
| JP | 2002 062493 | 2/2002 |
| JP | 2002-270575 | 9/2002 |
| JP | 2002-355800 | 12/2002 |
| JP | 2003001598 A | 1/2003 |
| JP | 2004-102022 A | 4/2004 |
| JP | 2004106074 A | 4/2004 |
| JP | 2004-212656 | 7/2004 |
| JP | 2005051007 A | 2/2005 |
| KR | 2002-9270 | 10/1999 |
| KR | 2000-0033006 | 6/2000 |
| TW | 157313 | 5/1991 |
| WO | WO 92/10925 | 6/1992 |
| WO | WO 95/30924 | 11/1995 |
| WO | WO9717628 | 5/1997 |
| WO | WO 99/34484 | 7/1999 |
| WO | WO 99/52006 | 10/1999 |
| WO | WO0114248 | 3/2001 |
| WO | WO 02/24570 | 3/2002 |
| WO | WO03007049 A1 | 1/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO2004006003 A1 | 1/2004 |
| WO | WO2004026757 A2 | 4/2004 |
| WO | WO 2005/019899 A1 | 3/2005 |
| WO | WO 2005/085932 | 9/2005 |

OTHER PUBLICATIONS

Notice Allowance dated Jul. 10, 2007 in U.S. Appl. No. 11/090,911.
Office Action dated Apr. 20, 2007 in U.S. Appl. No. 11/197,885.
IPRP for PCT/US05/030902 filed Aug. 30, 2005.
Official Action received Oct. 5, 2007 in Russian App. No. 2005111765.
Kawamura et al., Fabrication of fine metal microstructures packaged in the bonded glass substrates, Proceedings of SPIE, vol. 3893, pp. 486-493, 1999.
Office Action of Dec. 7, 2007 issued in corresponding Chinese Patent Application No. 03821986.7 (22 pages).
Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), Oct. 29, 2001, pp. 319-324.
Hall, Integrated optical inteferometric detection method for micromachined capacitiive acoustic transducers, App. Phy. Let. 80:20(3859-3961) May 20, 2002.
Matsumoto et al., Novel prevention method of stiction using silicon anodization for SOI structure, Sensors and Actuators, 72:2(153-159) Jan. 19, 1999.
Watanabe et al., Reduction of microtrenching and island formation in oxide plasma etching by employing electron beam charge neutralization, Applied Physics Letters, 79:17(2698-2700), Oct. 22, 2001.
Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Crouse, "Self-ordered pore structure of anodized aluminum on silicon and pattern transfer" Applied Physics Letters, vol. 76, No. 1, Jan. 3, 2000. pp. 49-51.
French, P.J. "Development of Surface Micromachining techniques compatable with on-chip electronics" Journal of Micromechanics and Microengineering vol. 6 No. 2, 197-211 XP 002360789 Jun. 1996 IOP Publishing.
Furneaux, et al. "The Formation of Controlled-porosity membranes from Anodically Oxidized Aluminum" Nature vo 337 Jan. 12, 1989, pp. 147-149.
Jerman J. H. et al., "Maniature Fabry-Perot Interferometers Micromachined in Silicon for Use in Optical Fiber WDM Systems," Transducers. San Francisco, Jun. 24-27, 1991, Proceedings of the International Conference on Solid State Sensors Andactuators, New Youk IEEE, US, vol. Conf. 6, Jun. 24, 1991.
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Maboudian, et al. Critical Review: Adhesion in Surface Micromechanical Structures: J. Vac. Sci Techno. B 15(1) Jan./Feb. 1997, pp. 1-20.
Microchem, Lor Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).

Penta Vacuum MEMS Etcher Specifications, http://www.pentavacuum.com/memes.htm, (Jan. 5, 2005).
Science and Technology, The Economist, pp. 89-90, (May 1999).
Search Report PCT/US05/031237 (Dec. 29, 2005).
Search Report PCT/US05/030033 and Written Opinion, (Dec. 30, 2005).
Search Report PCT/US05/030902, (Jan. 26, 2006).
Search Report and Written Opinion for PCT/US05/33558 (May 19, 2005).
Search Report PCT/US05/032331 (Apr. 7, 2006).
Search Report PCT/US05/032331 (Jan. 9, 2006).
Search Report and written opinion PCT/US05/032647, (Dec. 28, 2005).
Xactix Xetch X Specifications, http://xactix.com/Xtech X3specs. htm. Jan. 5, 2005.
Akasaka, "Three-Dimensional IC Trends," Proceedings of IEEE, vol. 74, No. 12, pp. 1703-1714, (Dec. 1986).
Austrian Search Report dated May 4, 2005.
Austrian Search Report dated Aug. 12, 2005.
Aratani et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K. W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jerman et al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).

Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060—Mar. 1996.
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
PCT/US02/13442, Search Report Sep. 13, 2002.
PCT/US04/20330 Search Report Nov. 8, 2004.
PCT/US05/029821 International Search Report (Dec. 27, 2005).
PCT/US05/030927 International Search Report, (Jan. 25, 2006).
PCT/US05/031693 International Search Report, (Jan. 25, 2006).
PCT/US05/032331 International Search Report (Apr. 7, 2006).
PCT/US05/033558 Partial International Search Report (Feb. 24, 2006).
PCT/US2004/035820 International Search Report and Written Opinion (Apr. 11. 2005).
PCT/US96/17731 Search Report, (Jan. 28, 1997).
Raley et al., "A Fabry-Perot Microinterferometer for Visible Wavelengths," IEEE Solid-State Sensor and Actuator Workshop, Jun. 1992, Hilton Head, SC.
Schnakenberg et al., "TMAHW Etchants for Silicon Micromachining," 1991 International Conference on Solid State Sensors and Actuators—Digest of Technical Papers, pp. 815-818 (1991).
Sperger et al., "High Performance Patterned All-Dielectric Interference Colour Filter for Display Applications," SID Digest, pp. 81-83, (1994).
Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Walker et al., "Electron-beam-tunable Interference Filter Spatial Light Modulator," Optics Letters vol. 13, No. 5, pp. 345-347, (May 1988).
Williams et al., "Etch Rates for Micromachining Processing," Journal of Microelectromechanical Systems, vol. 5, No. 4, pp. 256-259 (Dec. 1996).
Winters et al., "The etching of silicon with XeF2 vapor. Applied Physics Letters," vol. 34, No. 1, pp. 70-73 (Jan. 1979).
Winton, "A novel way to capture solar energy," Chemical Week, (May 1985).
Wu, "Design of a Reflective Color LCD Using Optical Interference Reflectors," Asia Display '95, pp. 929-931, (Oct. 1995).
Zhou et al., "Waveguide Panel Display Using Electromechanical Spatial Modulators" SID Digest, vol. XXIX, (1998).
Examiner's Report dated Feb. 26, 2008 in Australian App. No. 2003275194.
Office Action dated May 9, 2008 in Chinese App. No. 03821986.7.
Office Action dated Aug. 15, 2008 in Chinese App. No. 03821986.7.
Official Action received May 26, 2008 in Russian App. No. 2005111765.
Office Action dated Nov. 14, 2008 in Chinese App. No. 200580032155.2.

* cited by examiner

MICROMECHANICAL SYSTEMS DEVICE COMPRISING A DISPLACEABLE ELECTRODE AND A CHARGE-TRAPPING LAYER

FIELD OF THE INVENTION

This invention relates to microelectromechanical systems devices. In particular it relates to thin film structures in microelctromechanical systems devices and to electromechanical and optical responses of such thin film structures.

BACKGROUND OF THE INVENTION

Today a wide variety of microelectromechanical systems (MEMS) devices may be fabricated using microfabrication techniques. Examples of these MEMS devices include motors, pumps, valves, switches, sensors, pixels, etc.

Often these MEMS devices harness principles and phenomena from different domains such as the optical, electrical and mechanical domains. Such principles and phenomena, while seemingly difficult to harness in the macroscopic world, can become extremely useful in the microscopic world of MEMS devices, where such phenomena become magnified. For example, electrostatic forces which are generally considered to be too weak in the macroscopic world to be harnessed, are strong enough in the microscopic world of MEMS devices to activate these devices, often at high speeds and with low power consumption.

Materials used in MEMS devices are generally selected based on their inherent properties in the optical, electrical, and mechanical domains and the characteristic response to input, such as for example, a driving or actuation voltage.

One problem affecting the fabrication of MEMS devices is that in some cases, a material having a highly desirable response to input, for example an optical response to incident light, may also have an undesirable response to input, for example, an electromechanical response to an actuation or driving voltage. To overcome, or at least reduce, the undesirable response, new materials have to be found or developed often at great expense.

Another problem with the fabrication of MEMS devices is that sometimes, a material selected for its characteristic response may become damaged due to exposure to chemical agents used during a particular microfabrication process. This causes the material to demonstrate less of the characteristic response to the input.

SUMMARY OF THE INVENTION

In one embodiment, the invention provides a method for fabricating a microelectromechanical systems device. The method comprises fabricating a first layer comprising a film or structured film having a characteristic electromechanical response, and a characteristic optical response, wherein the characteristic optical response is desirable and the characteristic electromechanical response is undesirable; and modifying the characteristic electromechanical response of the first layer by manipulating charge build up thereon during activation of the microelectromechanical systems device.

DETAILED DESCRIPTION

A particular structure or layer within a microelectromechanical systems (MEMS) device may be desirable for its optical response to input in the form of incident light, but may at the same time have an undesirable electromechanical response to input in the form of an actuation or driving voltage. The present invention discloses techniques to manipulate or control the electromechanical response of the structure or layer, thus at least reducing the undesirable electomechanical response.

Figure 1:
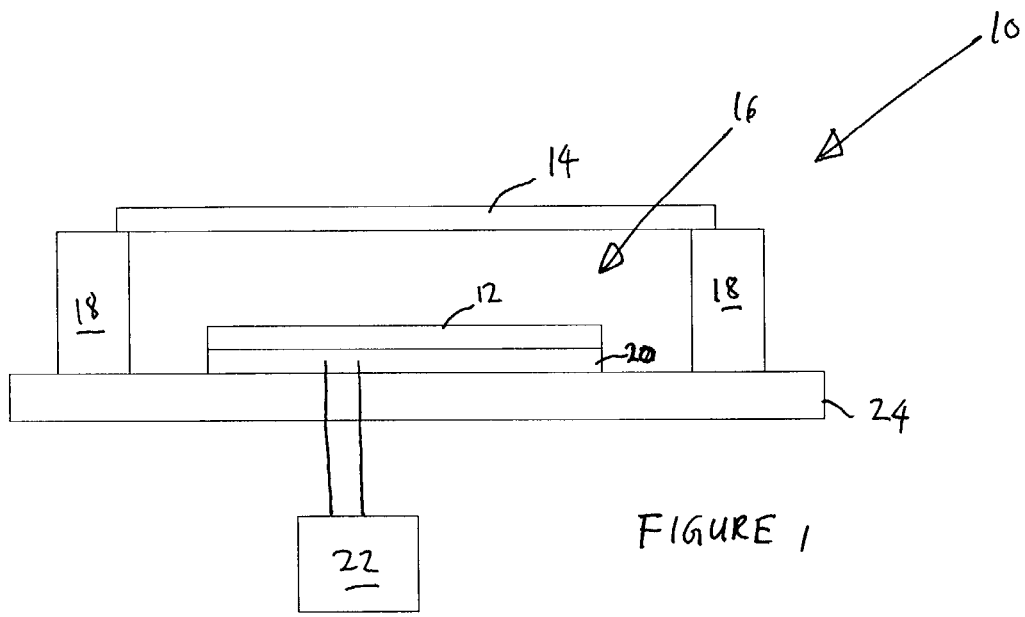
FIGS. 1 and 2 show a block diagram of a MEMS device in an unactuated, and an actuated state respectively.

As an illustrative, but a non-limiting example of a MEMS device, consider the interference modulator (IMOD]) device 10 shown in FIG. 1 of the drawings. Referring to FIG. 1, it will be seen that IMOD device 10 has been greatly simplified for illustrative purposes so as not to obscure aspects of the present invention.

Figure 2:
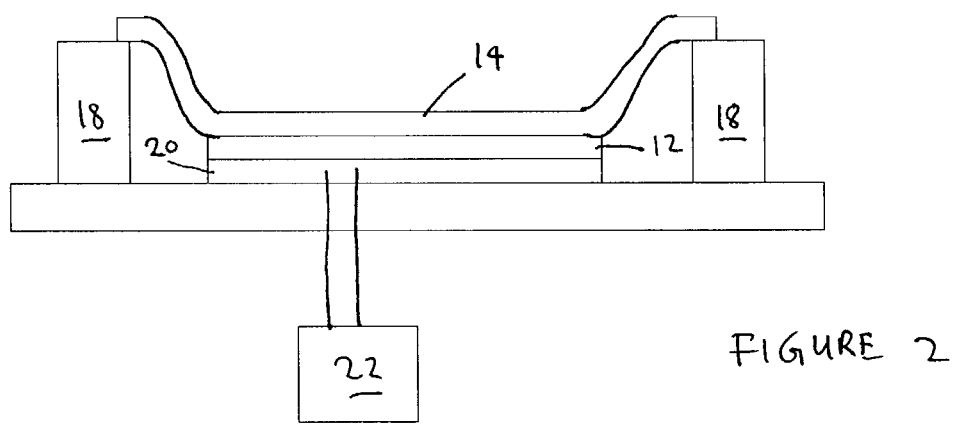

The IMOD device 10 includes a transparent layer 12 and a reflective layer 14 which is spaced from the transparent layer 12 by an air gap 16. The transparent layer 14 is supported on posts 18 and is electrostatically displaceable towards the transparent layer 12 thereby to close the air gap 16. An electrode 20 which is connected to a driving mechanism 22 is used to cause the electrostatic displacement of reflective layer 14. FIG. 1 shows the reflective layer 14 in an undriven or undisplaced condition, whereas FIG. 2 shows the reflective layer 14 in a driven or displaced condition. The reflective layer 14 is generally selected to produce a desired optical response to incident light when it is brought into contact with the transparent layer 12. In one IMOD design, the transparent layer 12 may comprise $SiO_2$. The electrode 20 and the transparent layer 12 are formed on a substrate 24. The substrate 24, the electrode 20, and the transparent layer 12 thereon will be referred to as a "thin film stack."

Typically, a plurality of IMOD devices 10 are fabricated in a large array so as to form pixels within a reflective display. Within such a reflective display, each IMOD device 10 essentially defines a pixel which has a characteristic optical response when in the undriven state, and a characteristic optical response when in the driven state. The transparent layer 12 and the size of the air gap 16 may be selected so that an IMOD within the reflective display may reflect red, blue, or green light when in the undriven state and may absorb light when in the driven state.

It will be appreciated that during operation of the reflective display, the IMOD devices 10 are rapidly energized, and de-energized in order to convey information. When energized, the reflective layer 14 of an IMOD 10 device is electrostatically driven towards the transparent layer 12, and when the IMOD 10 is de-energized, the reflective layer 14 is allowed to return to its undriven state. In order to keep the reflective layer 14 in its driven condition, a bias voltage is applied to each IMOD device 10.

If an actuation voltage, $V_{actuation}$, defined as a voltage required to electrostatically drive the reflective layer 14 of an IMOD device to its driven condition, as showed in FIG. 2 of the drawings, is equal to a release voltage, $V_{release}$, defined as the voltage at which the reflective layer 14 returns to its undisplaced condition, as is shown in FIG. 1 of the drawings, then it becomes extremely difficult to select an appropriate bias voltage, $V_{bias}$, that can be applied to all of the IMOD's 10 within the reflective display to keep the reflective layers 14 of each respective IMOD device 10 within the reflective display in its driven condition. The reason for this is that each IMOD 10 within the reflective display may have slight variations, for example, variations in a thickness of the layers 12, 14, etc., which, in practice, result in a different release voltage, $V_{release}$, for each IMOD 10. Further, due to line resistance, there will be variations in the actual voltage applied to each IMOD 10, based on its position within the display. This makes it very difficult, if not impossible, to select a value for $V_{bias}$ that will keep the reflective layer 14 of each respective IMOD 10 within the reflective display in its driven condition. This is explained with reference to FIG. 3 of the drawings, which shows the observed hysteresis behavior of the reflective layer 14 of an IMOD 10, in which the transparent layer 12 comprised $SiO_2$.

Figure 3:
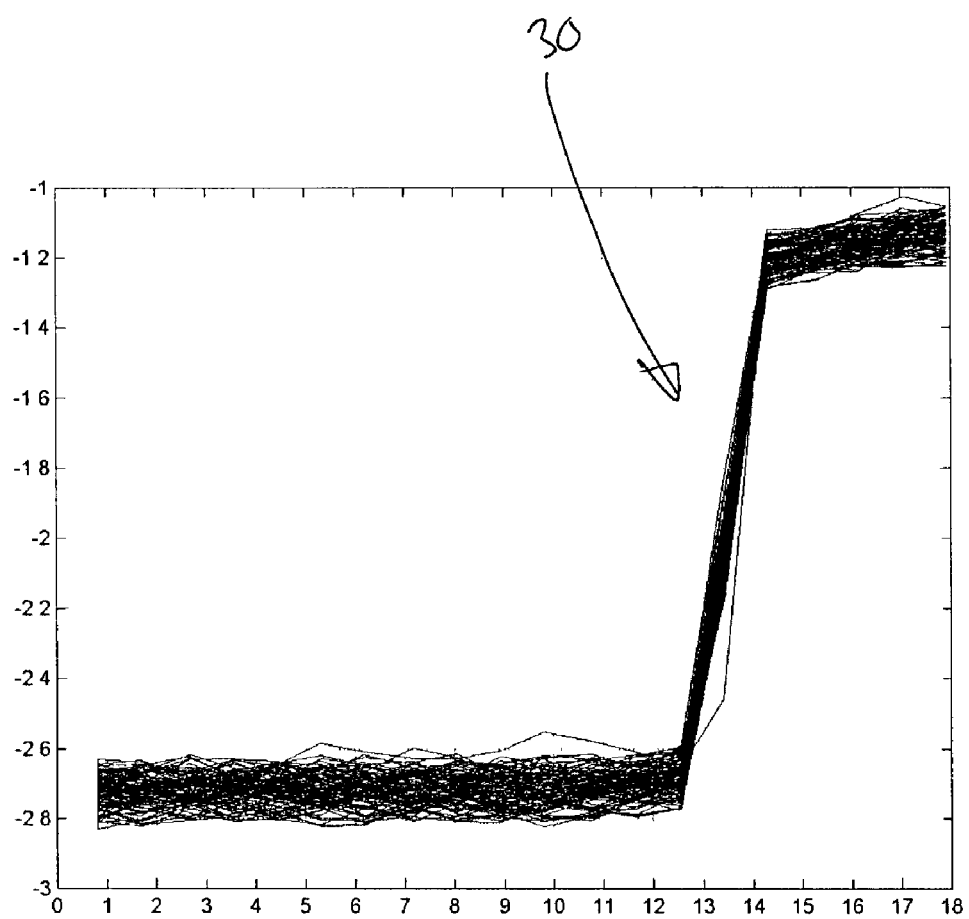
FIG. 3 shows a chart of the actuation and release voltages for the MEMS device of FIGS. 1 and 2.

Referring to FIG. 3, a curve, 30 is shown, which plots applied voltage (in volts) on the X-axis, against optical response measured in the volts on the Y-axis for an IMOD 10 comprising a transparent layer of $SiO_2$. As can be seen, actuation of the reflective layer 14 occurs at about 12.5 volts, i.e., $V_{actuation}$ equals 12.5 volts, and the reflective layer 14 returns to its undriven condition when the applied voltage falls to below 12.5 volts, i.e., $V_{release}$, equals 12.5 volts. Thus, the reflective layer 14 in an IMOD device 10 in which the transparent layer comprises only $SiO_2$ demonstrates no hysteresis. Therefore, if the reflective display is fabricated using IMOD devices 10, each comprising a transparent layer 12 having only $SiO_2$, it would be impossible to select a value for $V_{bias}$. For example, if $V_{bias}$ is selected to be 12.5 volts, because of variations within the IMOD devices 10 in the reflective display, for at least some of the IMOD devices 10, a $V_{bias}$ of 12.5 volts would fail to keep the reflective layer 14 of those IMOD devices 10 in the driven condition.

In order to select a $V_{bias}$ that is sufficient to keep the reflective layer 14 of a respective IMOD device 10 within a reflective display in its driven condition, it is necessary for each reflective layer 14 of a respective IMOD device 10 within the reflective display to demonstrate some degree of hysteresis, defined as a non-zero difference between the $V_{actuation}$ and $V_{release}$.

It will be appreciated that the electromechanical response of the reflective layer 14 of each IMOD device 10 is determined by the electromechanical properties of the reflective layer 14 as well as the electrical properties of the transparent layer 12. In one particular IMOD device design, the transparent layer 12 comprises $SiO_2$ which gives a desired optical response when the reflective layer 14 is brought into contact therewith. However, the transparent layer 12 comprising $SiO_2$ has a certain electrical characteristic or property (the $SiO_2$ traps negative charge) that affects the hysteresis behavior of the reflective layer 14. Thus, the transparent layer 12 has a desired optical response but an undesirable electromechanical response to a driving or actuation voltage which affects the hysteresis behavior of the reflective layer 14.

In accordance with embodiments of the present invention, the electromechanical behavior of the transparent layer 12 is altered by adding a further layer to the thin film stack. This further layer at least minimizes or compensates for the effect of transparent layer 12 on the hysteresis behavior of the reflective layer 14.

Figure 4:
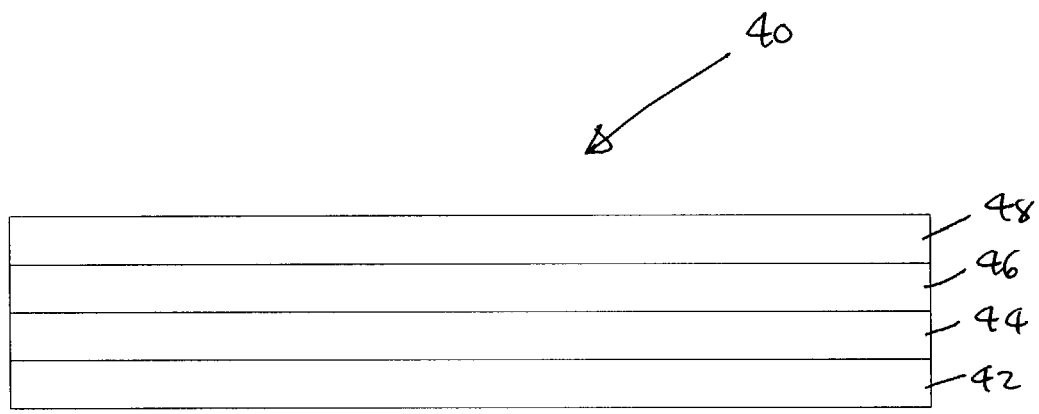
FIG. 4 shows one embodiment of a thin film stack for a MEMS device, in accordance with one embodiment of the invention.

In one embodiment of the invention, the further layer comprises $Al_2O_2$ which is deposited, in accordance with known deposition techniques, over the transparent layer 12. This results in a thin film stack 40 as shown in FIG. 4 of the drawings, comprising a substrate 42, an electrode 44, an $SiO_2$ reflective layer 46 and an $Al_2O_3$ layer 48 which functions as a charge trapping layer.

Figure 5:
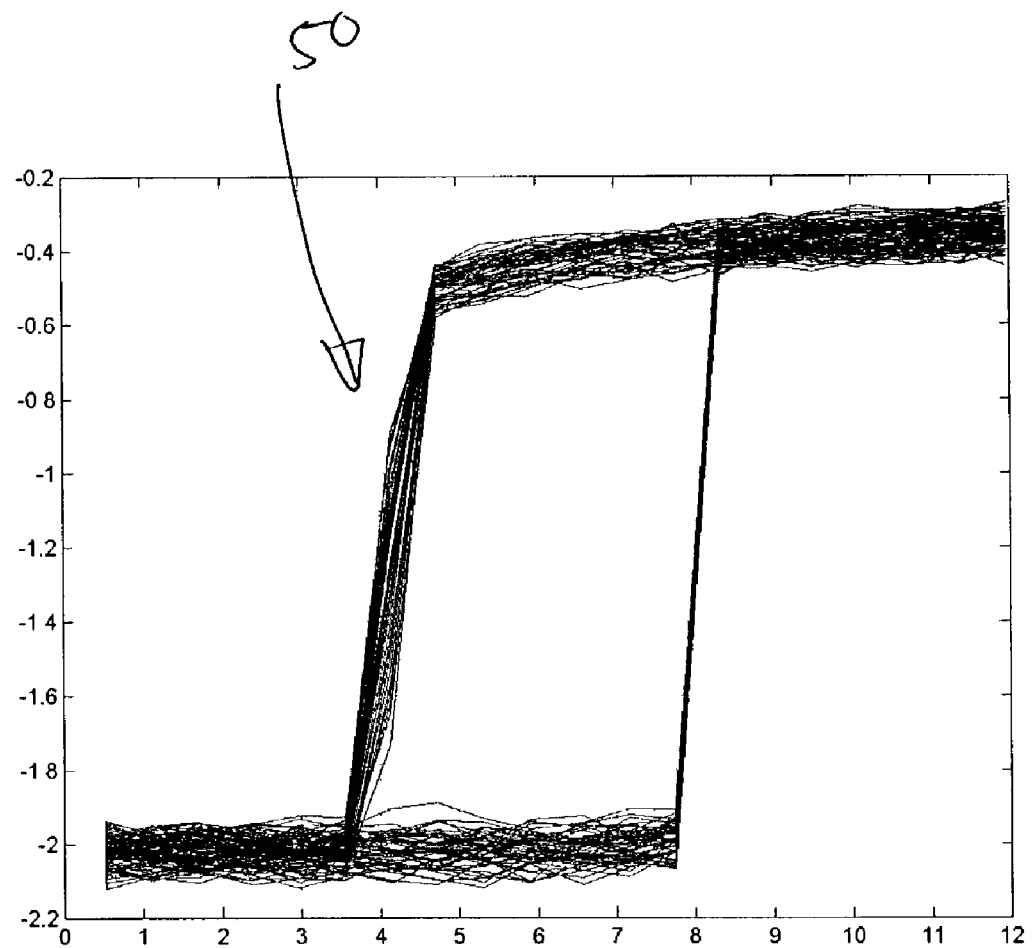
FIG. 5 shows a hysteresis curve for a MEMS device including the thin film stack shown in FIG. 4 of the drawings.

FIG. 5 of the drawings shows a hysteresis curve 50 for an IMOD device 10 comprising the thin film stack 40. As with the hysteresis curve 30, the X-axis plots applied voltage in Volts, whereas the Y-axis plots optical response in Volts. The hysteresis curve 50 shows a hysteresis window of 2.8 volts defined as the difference between $V_{actuation}$ (7.8 volts) and $V_{release}$ (5.0 volts). When the individual IMOD's 10 within a reflective display each have a respective reflective layer 14 which demonstrates hysteresis in accordance with the hysteresis curve 50, it will be seen that it is possible to choose a value for the $V_{bias}$ between 5 volts and 7.8 volts which will effectively perform the function of keeping the reflective layer 14 of each respective IMOD device 10 within the reflective display in its driven condition. In a further embodiment of the invention, the thin film stack may be further modified to include an $Al_2O_3$ layer above, as well as below, the reflective layer 12. This embodiment is shown in FIG. 6 of the drawings, where it will be seen that the thin film stack 60 includes a substrate 62, an electrode 64, a first $Al_2O_3$ layer 66, an $SiO_2$ transparent layer 68 and a second $Al_2O_3$ layer 70.

Figure 6:
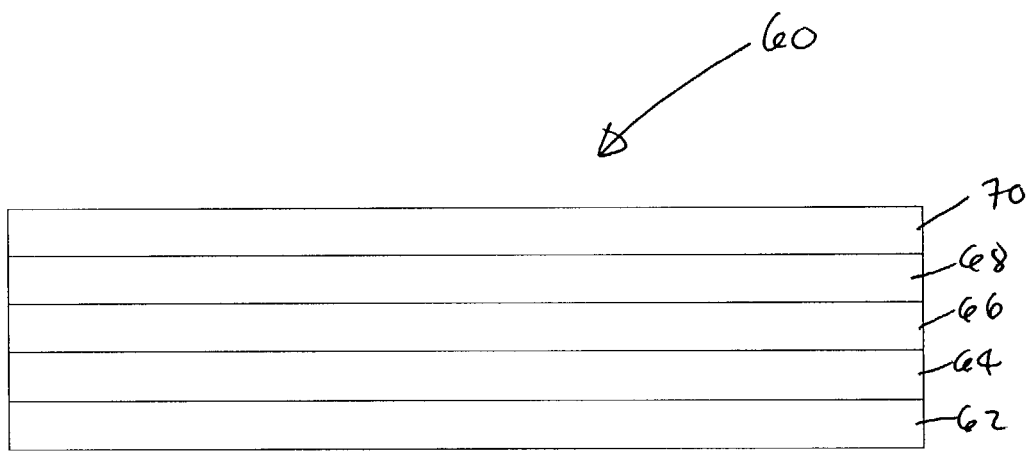
FIG. 6 shows another embodiment of a thin film stack for a MEMS device.
Figure 7:
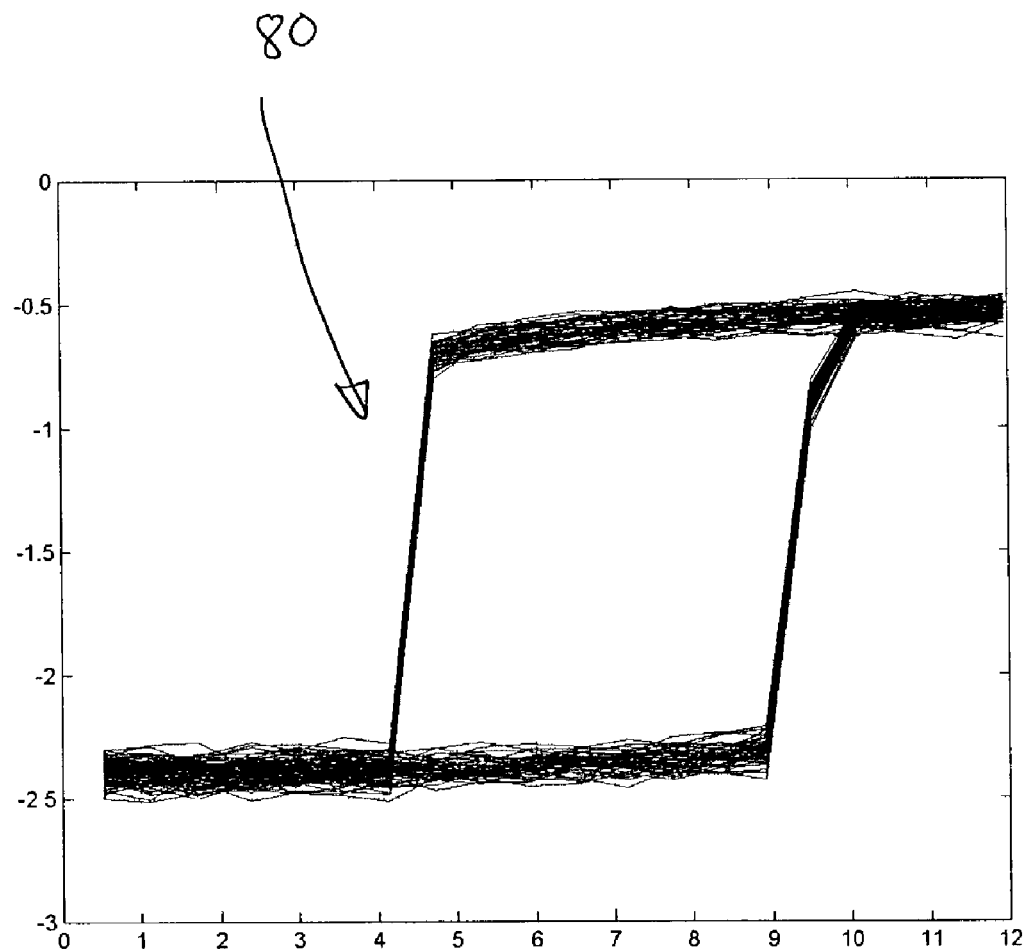
FIG. 7 shows a hysteresis curve for a MEMS device including the thin film stack of FIG. 6 of the drawings.

FIG. 7 of the drawings shows a hysteresis curve 80 for a transparent layer 14 of an IMOD device 10 having the thin film stack 60 shown in FIG. 6 of the drawings. As will be seen, the hysteresis window is now wider, i.e., 4.5 volts, being the difference between $V_{actuation}$ (9 volts) and $V_{release}$ (4.5 volts).

However, other materials that have a high charge trapping density may be used. These materials include $AlO_x$, which is the off-stoichiometric version of $Al_2O_3$, silicon nitride ($Si_3N_4$), its off-stoichiometric version ($SiN_x$), and tantalum pentoxide ($Ta_2O_5$) and its off-stoichiometric version ($TaO_x$). All of these materials have several orders of magnitude higher charge trapping densities than $SiO_2$ and tend to trap charge of either polarity. Because these materials have a high charge trapping density, it is relatively easy to get charge into and out of these materials, as compared to $SiO_2$, which has a low charge trapping density and has an affinity for trapping negative charge only.

Other examples of materials that have a high charge trapping density include the rare earth metal oxides (e.g., hafinium oxide), and polymeric materials. Further, semiconductor materials doped to trap either negative or positive charge may be used to form the further layer above, and optionally below the $SiO_2$ transparent layer 12.

Thus far, a technique for manipulating the electromechanical behavior of a MEMS device has been described, wherein charge buildup within the MEMS device is controlled by the use of a charge trapping layer which has a high charge trapping density. However, it is to be understood that the invention covers the use of any charge trapping layer to alter or control the electromechanical behavior of a MEMS device regardless of the charge trapping density thereof. Naturally, the choice of a charge trapping layer whether it be of a high, low, or medium charge trapping density will be dictated by what electromechanical behavior for a MEMS device is being sought.

In some embodiments the incorporation of metals, in the form of thin layers or aggregates, provide yet another mechanism for manipulating the charge trapping density of a host film in a MEMS device. Structuring the host film by producing voids or creating a variation or periodicity in its material characteristics may also be used to alter the charge trapping characteristics.

According to another embodiment of the invention, an IMOD device 10 includes a chemical barrier layer deposited over the reflective layer 12 in order to protect the reflective layer 12 from damage or degradation due to exposure to chemical etchants in the microfabrication process. For example, in one embodiment, the transparent layer 12 which comprises $SiO_2$, is protected by an overlying layer comprising $Al_2O_3$, which acts as a chemical barrier to etchants, for example, $XeF_2$. In such embodiments, it has been found that when the transparent $SiO_2$ layer 12 is protected from the etchants, nonuniformities in the SiO2 are eliminated along with attendant nonuniformities in electromechanical behavior, thus causing the transparent layer 14 within each IMOD device 10 to display hysteresis.

Figure 8A:
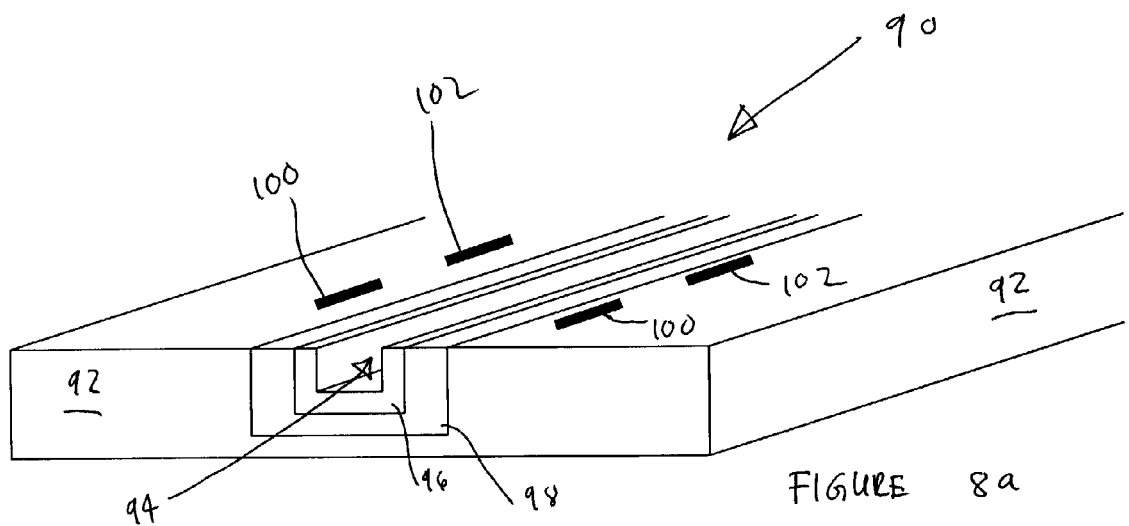
FIG. 8a shows a block diagram of an electrostatic fluid flow system within a MEMS device in accordance with one embodiment of the invention.
Figure 8B:
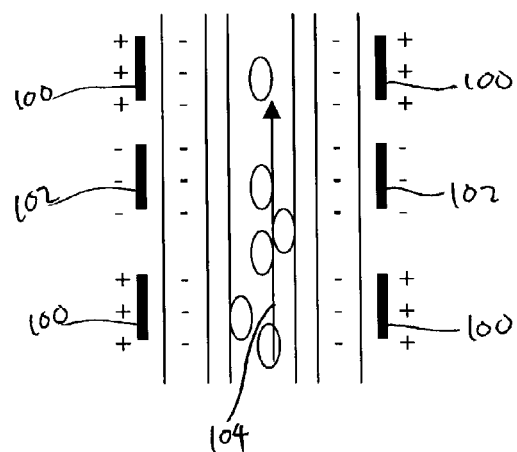
FIG. 8b shows a schematic drawing of the fluid flow system of FIG. 8a illustrating its principle of operation.

FIGS. 8a and 8b show another application within a MEMS device wherein a charged trapping layer is used to control the electromagnetic behavior of a structure within the MEMS device.

Referring to FIG. 8a, reference numeral 90 generally indicates a portion of an electrostatic fluid flow system. The electrostatic fluid flow system includes a substrate 92 within which is formed a generally U-shaped channel 94. The channel 94 includes an inner layer 96 of a first material which is selected, for example, because of its chemical and mechanical properties, for example, the material may be particularly wear-resistant, and may demonstrate little degradation due to the flow a fluid within the channel. The channel 94 also includes an outer layer 98 which is selected for its charge-trapping properties, as will be explained in greater detail below.

The electrostatic fluid flow system 90 also includes pairs of electrodes 100 and 102 which are selectively energized to cause displacement of charge particles within a fluid in the channel 94 in the direction indicated by the arrow 104 in FIG. 8b of the drawings. In one embodiment, the outer layer 98 traps charge in the fluid thereby to provide greater control of fluid flow within the system 101. In another embodiment, the layer 98 may trap charge in order to eliminate or to reduce hysteresis effects.

Figure 9:
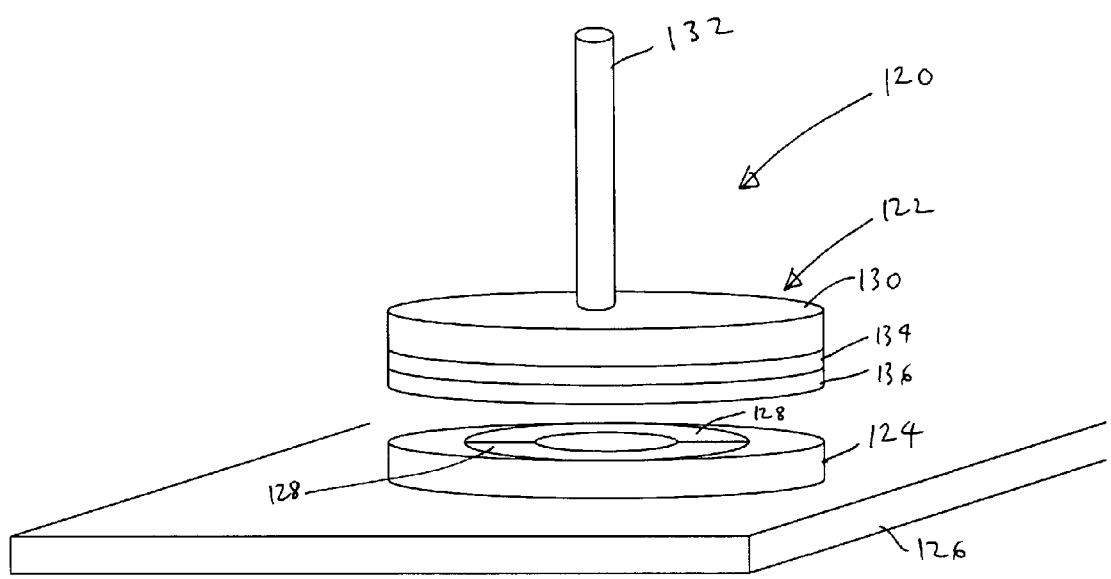
FIG. 9 shows another embodiment of a MEMS device in accordance with the invention.

Referring now to FIG. 9 of the drawings, another application of using a charge-trapping layer to alter the electromechanical behavior of a structure within a MEMS device is shown. In FIG. 9, reference numeral 120 generally indicates a motor comprising a rotor 122 which is axially aligned and spaced from a stator of 124. As can be seen, the stator 124 is formed on a substrate 126 and includes electrodes 128, which, in use, are energized by a driving mechanism (not shown). The rotor 122 includes a cylindrical portion 130 which is fast with a spindle 132. The rotor 122 may be of a material that may be selected for its mechanical properties, including resistance to wear, but may have undesirable electrical properties in response to input, such as when the electrodes 128 are energized in order to cause rotation of the rotor 122. In order to compensate for these undesirable electrical properties, layers 134 and 136 are deposited on the rotor 122 in order to effectively act as a charge trapping layer to alter the electromechanical behavior of the rotor 122.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

It is claimed:

1. A microelectromechanical systems device comprising:
    a substrate;
    a first electrode located over the substrate;
    a displaceable layer, wherein the displaceable layer comprises a second electrode;
    an air gap, wherein said air gap is located between the first electrode and the second electrode;
    a charge-trapping layer located between one of the electrodes and the air gap, wherein the charge-trapping layer comprises a material capable of trapping both positive and negative charge, and wherein the charge trapping layer is configured to increase a difference between an actuation voltage and a release voltage of the microelectromechanical systems device relative to the device without the charge trapping layer; and
    a transparent layer formed between the charge-trapping layer and said one of the electrodes; and
    a layer comprising $Al_2O_3$ located between the transparent layer and said one of the electrodes, wherein the layer comprising $Al_2O_3$ is located directly adjacent said one of the electrodes.

2. The device of claim 1, wherein the microelectromechanical systems device comprises an interferometric modulator, and wherein the interferometric modulator is operable to reflect light of a certain wavelength.

3. The device of claim 1, wherein the displaceable layer is movable between a first position and a second position, and wherein the device has a first optical response when the displaceable layer is in the first position, and a second optical response when the displaceable layer is in the second position.

4. The device of claim 3, wherein the device reflects a light of a certain wavelength when the displaceable layer is in the first position, and wherein the device absorbs the light when the displaceable layer is in the second position.

5. The device of claim 1, wherein the device comprises a reflective display.

6. The device of claim 1, wherein the charge-trapping layer comprises a material selected from the group of $AlO_x$ (non-stoichiometric), $Si_3N_4$, $SiN_x$ (non-stoichiometric), $Ta_2O_5$, and $TaO_x$ (non-stoichiometric).

7. A microelectromechanical systems device comprising:
    a fixed electrode located over a substrate;
    an electrostatically displaceable layer separated from the fixed electrode by an air gap;
    a layer comprising $Al_2O_3$ located over the fixed electrode;
    a transparent layer located over the layer comprising $Al_2O_3$; and
    a charge-trapping layer located over the transparent layer.

8. The device of claim 7, wherein the transparent layer comprises $SiO_2$.

9. The device of claim 7, wherein the charge-trapping layer comprises a material selected from the group of $AlO_x$ (non-stoichiometric), $Si_3N_4$, $SiN_x$ (non-stoichiometric), $Ta_2O_5$, and $TaO_x$ (non-stoichiometric).

10. The device of claim 7, wherein the charge-trapping layer comprises $Al_2O_3$.

11. The device of claim 10, wherein the transparent layer comprises $SiO_2$.

12. The device of claim 7, wherein the device comprises an interferometric modulator.

13. The device of claim 7, wherein the device comprises a reflective display.

* * * * *